(12) United States Patent
Seo

(10) Patent No.: US 7,781,851 B2
(45) Date of Patent: Aug. 24, 2010

(54) SEMICONDUCTOR DEVICE HAVING REDUCED DIE-WARPAGE AND METHOD OF MANUFACTURING THE SAME

(75) Inventor: Hyeoung-won Seo, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 899 days.

(21) Appl. No.: 11/320,985

(22) Filed: Dec. 30, 2005

(65) Prior Publication Data

US 2006/0163689 A1    Jul. 27, 2006

(30) Foreign Application Priority Data

Jan. 12, 2005    (KR) .................. 10-2005-0002872

(51) Int. Cl.
*H01L 23/495* (2006.01)
*H01L 29/40* (2006.01)

(52) U.S. Cl. .................. 257/418; 257/178; 257/668; 257/669; 257/758

(58) Field of Classification Search ................ 257/178, 257/418, 668, 758
See application file for complete search history.

(56) References Cited

U.S. PATENT DOCUMENTS

| | | | | |
|---|---|---|---|---|
| 4,654,269 A | * | 3/1987 | Lehrer | 428/428 |
| 4,918,511 A | * | 4/1990 | Brown | 257/669 |
| 5,413,962 A | * | 5/1995 | Lur et al. | 438/619 |
| 5,506,759 A | * | 4/1996 | Shirai et al. | 362/462 |
| 5,915,169 A | * | 6/1999 | Heo | 438/118 |
| 6,184,121 B1 | * | 2/2001 | Buchwalter et al. | 438/622 |
| 6,211,057 B1 | * | 4/2001 | Lin et al. | 438/619 |
| 6,504,250 B1 | * | 1/2003 | Allman et al. | 257/758 |
| 6,830,960 B2 | * | 12/2004 | Alcoe et al. | 438/122 |
| 6,879,015 B2 | * | 4/2005 | Liang et al. | 257/459 |
| 7,049,685 B2 | * | 5/2006 | James et al. | 257/669 |
| 7,279,779 B2 | * | 10/2007 | Letertre et al. | 257/669 |
| 2002/0130412 A1 | * | 9/2002 | Nagai et al. | 257/737 |
| 2003/0094676 A1 | * | 5/2003 | Huang et al. | 257/669 |
| 2003/0107110 A1 | * | 6/2003 | Ma | 257/633 |
| 2005/0064693 A1 | * | 3/2005 | Liu et al. | 438/612 |
| 2005/0202590 A1 | * | 9/2005 | Huang et al. | 438/106 |
| 2006/0105497 A1 | * | 5/2006 | Suh et al. | 438/108 |

FOREIGN PATENT DOCUMENTS

| | | |
|---|---|---|
| JP | 11307525 | 11/1999 |
| JP | 2003-273357 | 9/2003 |
| KR | 2001-0105641 | 11/2001 |

* cited by examiner

*Primary Examiner*—Matthew C Landau
*Assistant Examiner*—James M Mitchell
(74) *Attorney, Agent, or Firm*—Volentine & Whitt, PLLC

(57) ABSTRACT

A semiconductor device and a method of manufacturing the same reduce die-warpage. The semiconductor device includes a substrate and a first layer of material extending substantially over the entire surface of the substrate. A stress-relieving pattern exists in and traverses the first layer so as to partition the first layer into at least two discrete sections. The stress-relieving pattern may be in the form of an interface between the discrete sections of the first layer, or a wall of material different from the material of the first layer.

43 Claims, 13 Drawing Sheets

SEMICONDUCTOR DEVICE HAVING REDUCED DIE-WARPAGE AND METHOD OF MANUFACTURING THE SAME

BACKGROUND OF THE INVENTION

1. Field of the Invention

The present invention relates to a semiconductor device and to a method of manufacturing the same. More particularly, the present invention relates to the die of a semiconductor device, and to a method of manufacturing the same.

2. Description of the Related Art

Semiconductor devices generally comprise a semiconductor chip (die) and a package for the chip. The semiconductor chip, in turn, generally includes a substrate (portion of a wafer) and circuit patterns disposed on the substrate. A major goal in the manufacturing of today's semiconductor devices is to make the devices thinner and lighter. To achieve this, the packages of the devices or the semiconductor chips must be made smaller. Examples of small packages that have recently been developed are the Wafer Level Package (WLP) and the Surface Mount Package (SMP). Reducing the size of the semiconductor chip requires the forming of finer circuit patterns and/or reducing the thickness of the substrate.

Among these methods, increasing the amount of back-lap of the wafer to reduce the overall thickness of the semiconductor chip (die) is the most basic and essential way of ultimately reducing the size of the semiconductor chip. For example, the thickness of a wafer of a DRAM device after back-lap currently exceeds 250 μm, although the wafers from which DRAMS are made are gradually becoming thinner.

However, as the wafer of a semiconductor chip becomes thinner, a die-warpage phenomenon in which the die tends to bend and warp laterally and/or longitudinally becomes more severe. Die-warpage causes the surface of a semiconductor device to become uneven, as shown in FIG. 1.

More specifically, a fully fabricated semiconductor device has a plurality of conductive and isolating patterns and insulating layers stacked one atop the other on a substrate. The die warps due to stress in an upper and/or lower portion of the stacked structure, i.e., due to resultant stress applied to a semiconductor substrate by the layers that constitute the stacked structure. The layers which cover the entire surface of the semiconductor substrate cause the most severe stress. Such layers include interlayer insulating layers (ILD and an IMD layers), passivation layers, and PhotoSensitive PolyImide (PSPI) layers. Die-warpage will now be described in more detail using the PSPI layer as an example.

FIG. 2A is a plan view of a conventional semiconductor device including a PSPI layer. FIG. 2B is a sectional view of the semiconductor device, taken along line AA' of FIG. 2A, and FIG. 2C is a sectional view of the semiconductor device taken along line BB'.

Referring to FIGS. 2A, 2B and 2C, electrodes used as connection pads 12 are formed in the uppermost surface of a substrate 10. Also, fuse lines 14 are formed in portions of the substrate 10 located beneath the uppermost surface thereof. A passivation layer 20 for protecting the substrate 10 from humidity and/or impurities is disposed on the substrate 10. The passivation layer 20 may be a composite layer comprising a silicon oxide layer, such as a HDP oxide layer 22, and a silicon nitride layer such as a PE-SiN layer 24. A PSPI layer 30 is disposed on the upper surface of the passivation layer 20 to prevent soft errors caused by α-particles and to protect the substrate 10 from shock during subsequent processes, e.g., a packaging process.

First through-holes 40 extend through the PSPI layer 30 and the passivation layer 20 in alignment with the connection pads 12 at the upper surface of the substrate 10, thereby exposing the connection pads 12. Second through-holes 50 extend through the PSPI layer 30 and the passivation layer 20 as aligned with the fuse lines 14, thereby exposing the fuse lines 14. The arrangement of the through-holes 40, 50 depends on the positions and arrangement of the connection pads 12 and the fuse lines 14. FIG. 2A diagrammatically illustrates the through-holes 50 with respect to a current DRAM device. In this device, the second through-holes 50 are arranged in first and second rows 52, 54 that extend longitudinally and laterally in the die, respectively.

Table 1 shows the amount of die-warpage measured in semiconductor devices of the type shown in FIGS. 2A through 2C, wherein the substrates of the devices have various thicknesses $t_1$ (thickness after back-lap) and the PSPI layers 30 have various thicknesses $t_3$. Each of the devices was a rectangular 256M DDR DRAM device having a die of 4.9916 mm×10.047 mm.

TABLE 1

|  | Thickness $t_1$ of substrate (μm) | | | |
| --- | --- | --- | --- | --- |
|  | 75 | 100 | 150 | 200 |
| Thickness $t_3$ of PSPI layer (μm) 0 | 43.8 | 23.2 | 3.3 | 0.6 |
| 3.0 | 47.6 | 26.4 | 7.6 | 1.8 |
| 6.5 | 54.2 | 34.4 | 12.0 | 2.4 |

Referring to Table 1, the die-warpage was greatest in those devices having the thinnest substrates (smallest thickness $t_1$), and the thickest PSPI layer (greatest thickness $t_3$). The greater the thickness $t_3$ of the PSPI layer 30, the greater is the tensile stress. The die is severely warped due to such tensile stress. The PSPI layer 30 is formed by depositing a photosensitive polyimide material to a thickness of about 10 μm on the passivation layer 20, exposing and developing the resultant layer, and then baking the layer to imidize the material and remove impurities therefrom. The baking process, however, reduces the thickness of the layer to about 6~7 μm. Accordingly, a large compressive stress is applied to the substrate 10.

A method of reducing die-warpage caused by the PSPI layer is disclosed in Japanese Laid-open Patent No. 11-307525, entitled "Semiconductor device and a manufacturing method thereof." In this method, two kinds of polyimide materials are used to form a polyimide layer. Specifically, a substrate is sequentially coated with a non-photosensitive polyimide material and a photosensitive polyimide material. The non-photosensitive polyimide material that contacts the substrate has a relatively small compressive stress. Thus, the stress exerted on the substrate is relatively low. However, the process of forming this PSPI layer is relatively complex because two polyimide materials are used. Also, the two polyimide materials have different compressive stresses. Accordingly, it is difficult to control the amount of die-warpage. Moreover, the extent to which the underlying non-photosensitive polyimide layer can be removed during an etching process and the profile of the underlying non-photosensitive polyimide layer cannot be precisely controlled.

Also, referring to Table 1, die-warpage occurs even when no PSPI layer 30 is formed. It is believed that the stress caused by layers of material constituting the stacked structure on the substrate 10 cause the die-warpage. That is, the die-warpage occurs prior to forming the PSPI layer 30. For example, interlayer insulating layers such as ILDs and IMDs and the passivation layer 20, covering the entire surface of the substrate, may cause the die-warpage. Therefore, die-warpage is an unavoidable problem in any semiconductor device formed by stacking a plurality of layers of different material.

Because the die-warpage applies stress to conductive and non-conductive patterns and electrical devices disposed on the substrate, the reliability of the semiconductor device is degraded. Also, any die-warpage will almost certainly cause defects to occur during subsequent processes. For example, if a die that is warped is packaged, the packaging process might not package the die effectively, i.e., the die is apt to be broken by a minor shock when the device is handled, for example. Furthermore, an uneven layer of material, resulting from die-warpage, makes it difficult to precisely carry out a photolithographic process of forming a pattern on the semiconductor substrate.

SUMMARY OF THE INVENTION

An object of the present invention is to provide a semiconductor device that exhibits little die-warpage.

Another object of the present invention is to provide a method of manufacturing a semiconductor device which prevents the die from being warped.

According to an aspect of the present invention, there is provided a semiconductor device including a chip-sized substrate having a plurality of layers stacked thereon, wherein (at least) one of the layers has a stress-relieving pattern existing therein. The layer may be an interlayer insulating layer, a passivation layer or a photosensitive polyimide layer. The stress-relieving pattern traverses the layer and partitions the layer into at least two discrete sections.

The stress-relieving pattern may have more than one segment, and preferably, between about two and ten segments, that traverse the layer. At least one of the segments may cross one or more of the other segments. In the typical case of a rectangular chip, at least one segment of the stress-relieving pattern extends parallel to the shorter sides of the rectangular chip. The segment or segments may partition the layer into even sections.

The stress-relieving pattern may be in the form of an interface of the discrete sections of the layer. Alternatively, the stress-relieving pattern may be in the form of a wall of material different from the material of the layer in which the stress-relieving pattern exists. Preferably, the width of the wall is 0.01~20 µm. In the case in which the layer of material in which the stress-relieving pattern exists is a first layer, and a second layer of material covers substantially the entire surface of the first layer, the material of the wall constituting the stress-relieving pattern is the same as the material of the second layer.

According to another aspect of the invention, a stress-relieving pattern is provided in the second layer as partitioning the second layer into at least two discrete sections. In this case, at least one segment of the stress-relieving pattern in the second layer is offset with respect to each of the segments of the stress-relieving pattern in the first layer.

According to still another aspect of the present invention, there is provided a semiconductor device including a chip-sized substrate, a passivation layer extending directly on the substrate as covering substantially the entire surface of the substrate, and a photosensitive polyimide (PSPI) layer extending substantially over the entire surface of the passivation layer, wherein a stress-relieving pattern exists in the PSPI layer. In this case, the chip-sized substrate has a plurality of connection pads at the upper surface thereof and/or conductive material such as fuse lines running through the substrate at a level beneath the upper surface of the substrate. First through-holes extend through the passivation layer and the PSPI layer to expose the connection pads. Second through-holes extend through the passivation layer and the PSPI layer and into the substrate to expose the fuse lines. The stress-relieving pattern may connect at least some of the through-holes at portions thereof which extend through the PSPI layer. Preferably, the stress-relieving pattern connects at least some of the through-holes that are aligned with the fuse lines.

According to yet another aspect of the present invention, there is provided a method of manufacturing a semiconductor device, including providing a chip-sized substrate, and forming a first layer of material in at least two discrete sections over substantially the entire surface of the substrate. The sections are partitioned from one another by a stress-relieving pattern that traverses the first layer of material and by which stress otherwise applied to the substrate by the first layer is mitigated.

The at least two discrete sections of the first layer of material may be formed in contact with each other such that the interface between the at least two discrete sections constitutes the stress-relieving pattern. In this case, the discrete sections of the first layer of material are sequentially formed in situ over respective regions of the substrate. For example, an initial layer of material is formed over the surface of the substrate, a portion of the initial layer of material is then removed from over a region of the substrate, and subsequently the same type of material as the initial layer is deposited onto the region of the substrate from which the initial layer had been removed.

According to another aspect of the present invention, the stress-relieving pattern is instead formed by patterning the first layer to form at least one trench that traverses the first layer and partitions the first layer into at least two discrete sections, and subsequently filling the trench with a material that is different from the material of the first layer.

Furthermore, the method may include forming a second layer of material over substantially the entire surface of the first layer. In this case, a stress-relieving pattern may exist in the second layer as traversing the second layer so as to partition the second layer into at least two regions. The second stress-relieving pattern is formed so that at least one segment thereof is offset with respect to each segment of the stress-relieving pattern in the first layer. In this case, the second layer may be formed by the same deposition process used to fill the trench during the forming of the stress-relieving pattern in the first layer.

According to still another aspect of the invention, there is provided providing a method of manufacturing a semiconductor device, comprising forming a passivation layer over substantially the entire surface of a chip-sized, forming a layer of a photosensitive polyimide (PSPI) in at least two discrete sections over substantially the entire surface of the passivation layer, and forming a plurality of through-holes that extend through the passivation layer and the photosensitive polyimide layer. The sections of the PSPI layer are partitioned from one another by a stress-relieving pattern that traverses the PSPI layer and by which stress otherwise applied to the substrate by the first layer is mitigated. A plurality of connection pads are disposed on an upper surface of the substrate, and a plurality of fuse lines run in the substrate at a level beneath the connect pads. The through-holes expose the connection pads and the fuse lines.

The through-holes are formed using a mask. The mask has a pattern corresponding to that of the through-holes in the passivation layer. The passivation layer is etched using the mask as an etch mask to expose the connection pads, and the passivation layer and the substrate are etched to expose the fuse lines.

The PSPI layer and the stress-relieving pattern may be formed by forming an initial layer of photosensitive polyimide over substantially the entire surface of the passivation layer, and patterning the initial layer of photosensitive polyimide to form through-holes aligned with the pad connections and fuse lines and to form trenches that extend through the initial layer of photosensitive polyimide layer, and filling the trenches to form the stress-relieving pattern. In this case, the trenches may be formed as connecting at least some of the through-holes that extend through the photosensitive polyimide layer and preferably, the through-holes that are aligned with the fuse lines.

According to still another aspect of the present invention, there is provided a method of manufacturing a semiconductor device, wherein a respective stress-relieving pattern is formed in at least one of the layers stacked on the substrate of the device, and the configuration of the stress-relieving pattern is based on characteristics of the die-warpage that the device would otherwise exhibit if the stress-relieving pattern(s) were not present. More specifically, first, the die of the semiconductor device is designed. The die includes a chip-sized substrate and a plurality of layers stacked on and extending over substantially the entire surface of the substrate. The design parameters include the specifications of the die such as the thickness of the substrate, the thicknesses of the layers that are to be stacked on the substrate, and the materials from which the substrate and the layers are to be fabricated. Then, the die-warpage that the device would exhibit is characterized before the die is fabricated according to its design parameters. Subsequently, the die is fabricated according to the design parameters but, in this case, one of the layers is formed on the substrate in at least two discrete sections as partitioned from one another by a stress-relieving pattern. The configuration, at least, of the stress-relieving pattern is based on the characterization of the die-warpage in such a way as to mitigate stress that would otherwise be applied to the substrate in the die.

BRIEF DESCRIPTION OF THE DRAWINGS

The above and other objects, features and advantages of the present invention will become more apparent from the following detailed description of the preferred embodiments thereof made with reference to the attached drawings in which.

DETAILED DESCRIPTION OF THE PREFERRED EMBODIMENTS

Figure 1:
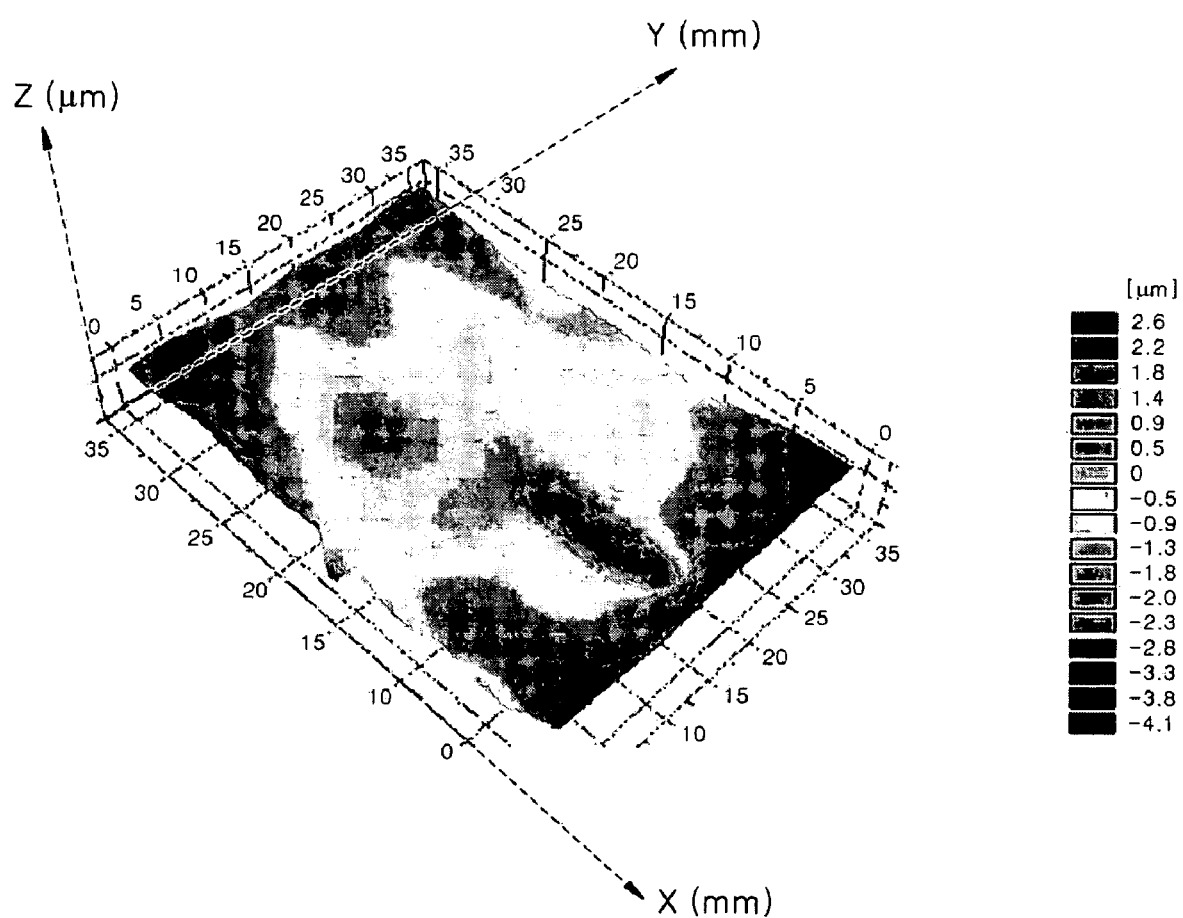
FIG. 1 is an aerial image of the die-warpage of a conventional semiconductor device.

The present invention will now be described more fully with reference to the accompanying drawings. Like reference numerals denote like elements throughout the drawings.

A semiconductor device according to the present invention has a stress relieving pattern to reduce die-warpage in a material layer formed on the entire surface of a chip-sized substrate. The stress relieving pattern alleviates stress in an underlying substrate and/or a material layer formed on the material layer (substrate). This is because the total stress applied to, for example, the underlying substrate, by the partitioned regions of the material layer is smaller than the total stress applied by a single material layer. This stress relieving pattern partitions the material layer into at least two regions, and thus alleviates the stress caused by the single material layer.

Referring to FIGS. 3A, 3B, 4A and 4B, a semiconductor device according to the present invention includes a chip-sized semiconductor substrate 110 or 210, and a layer 120 or 220 having a stress-relieving pattern 125 or 225. The substrate 110, 210 may be a monocrystalline silicon substrate, a silicon germanium substrate, or an SOI substrate. In addition, insulating layers and circuit devices and/or interconnect patterns may be interposed between the substrate 110, 210 and the layer 120, 220 having the stress-relieving pattern 125, 225. In any case, the layer 120, 220 having the stress-relieving pattern 125, 225 is disposed over a relatively wide region, e.g. the entire surface, of the substrate 110, 220. Considering the characteristics of the semiconductor device, the layer 120, 220 is generally of an insulating material. The purpose of the stress-relieving pattern 125, 225 is to alleviate the stress, compressive or tensile, otherwise imposed on the substrate 110, 220 by the layer 120, 220.

This stress is caused by several factors, one of which is the inherent characteristics of the material that constitutes the layer 120, 220.

Another cause of stress is annealing. When a semiconductor device is manufactured, annealing is performed at a temperature much higher than room temperature, to increase the density of the layer 120, 220 dense and/or to control its doping profile. The annealing may be performed just after the layer 120, 220 is formed. Annealing generally causes a compressive stress to be applied to the substrate 110, 210 because annealing causes the layer 120, 220 to contract. Furthermore, more than ten annealing cycles are typically carried out during the course of the semiconductor manufacturing process. Thus, the layer 120, 220 is likely to apply compressive stress to the substrate 110, 210 even if the material of the layer 120, 220 has tensile stress characteristics.

When compressive stress is applied to a substrate, the edges of the substrate are lifted upward and the central portion of the substrate bulges downward. According to the present invention, the compressive stress applied to the substrate 110, 210 by the layer 120, 220 can be mitigated by the stress-relieving pattern 125, 225 in the material layers 120, 220. The stress-relieving pattern 125, 225 partitions the layer 120, 220 into at least two sections to alleviate the stress transferred to the edges of the substrate 110, 210 by the layer 120, 220. For this purpose, preferably, the stress-relieving pattern 125, 225 traverses the layer 120, 220.

Figure 3A:
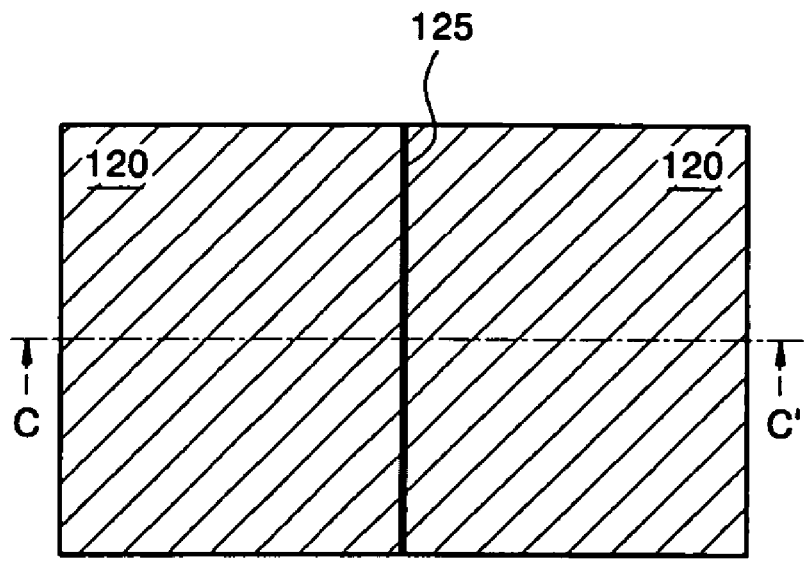
FIG. 3A is a plan view a chip of one embodiment of a semiconductor device according to the present invention.
Figure 3B:
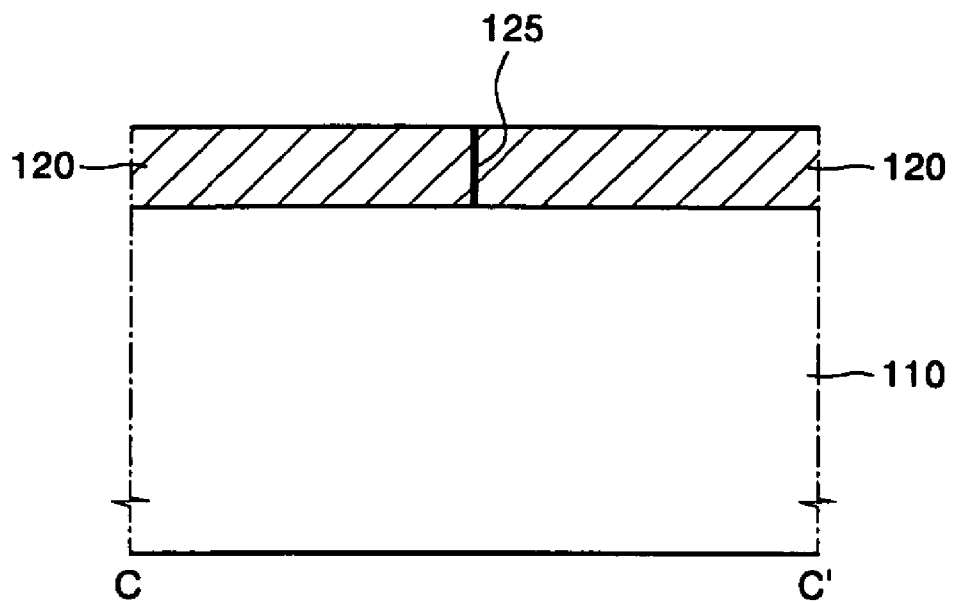
FIG. 3B is a sectional view of the chip of the semiconductor device, taken along line C-C' of FIG. 3A.

Referring to FIGS. 3A and 3B, one example of the stress-relieving pattern is an interface 125 extending between respective regions of the layer 120. That is, the layer 120 is not contiguous across the surface of the substrate 110 but comprises at least two discrete sections that contact each other at the interface 125. The interface 125 alleviates stress which would otherwise be applied to the substrate 110.

The layer 120 having an interface 125 as the stress-relieving pattern may be formed in several ways. For example, the sections of the layer may be subsequently formed using a plurality of photoresist masks to provide the interface 125 traversing the layer 120. Alternatively, a first layer is formed over the entire surface of the substrate 110, and then a portion of the first layer is removed by etching. Then, a second layer, of the same material as the first layer, is formed over that part of the substrate 110 from which the portion of the first layer had been removed.

Figure 4A:
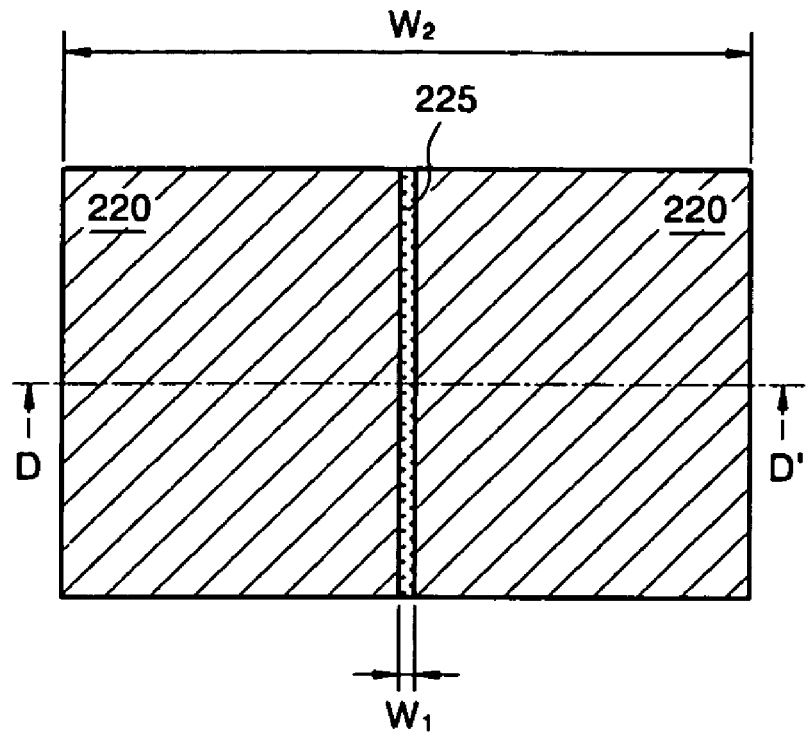
FIG. 4A is a plan view of a chip of another embodiment of a semiconductor device according to the present invention.
Figure 4B:
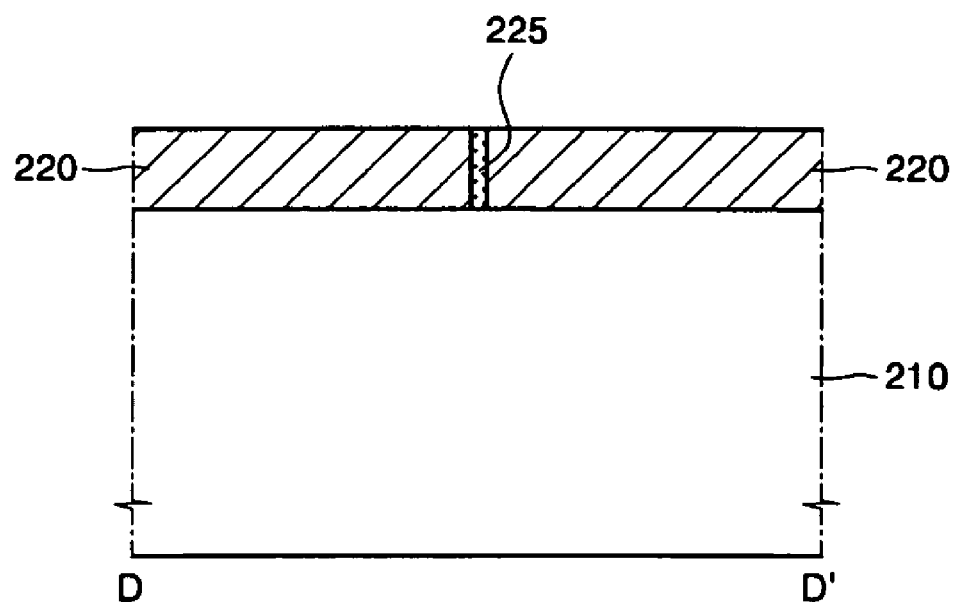
FIG. 4B is a sectional view of the chip of the semiconductor device, taken along line D-D' of FIG. 4A.

Referring to FIGS. 4A and 4B, another example of the stress-relieving pattern traversing the material layer 220 is a pattern 225 in the form of a wall of a material different from that of the layer 220.

Figure 9:
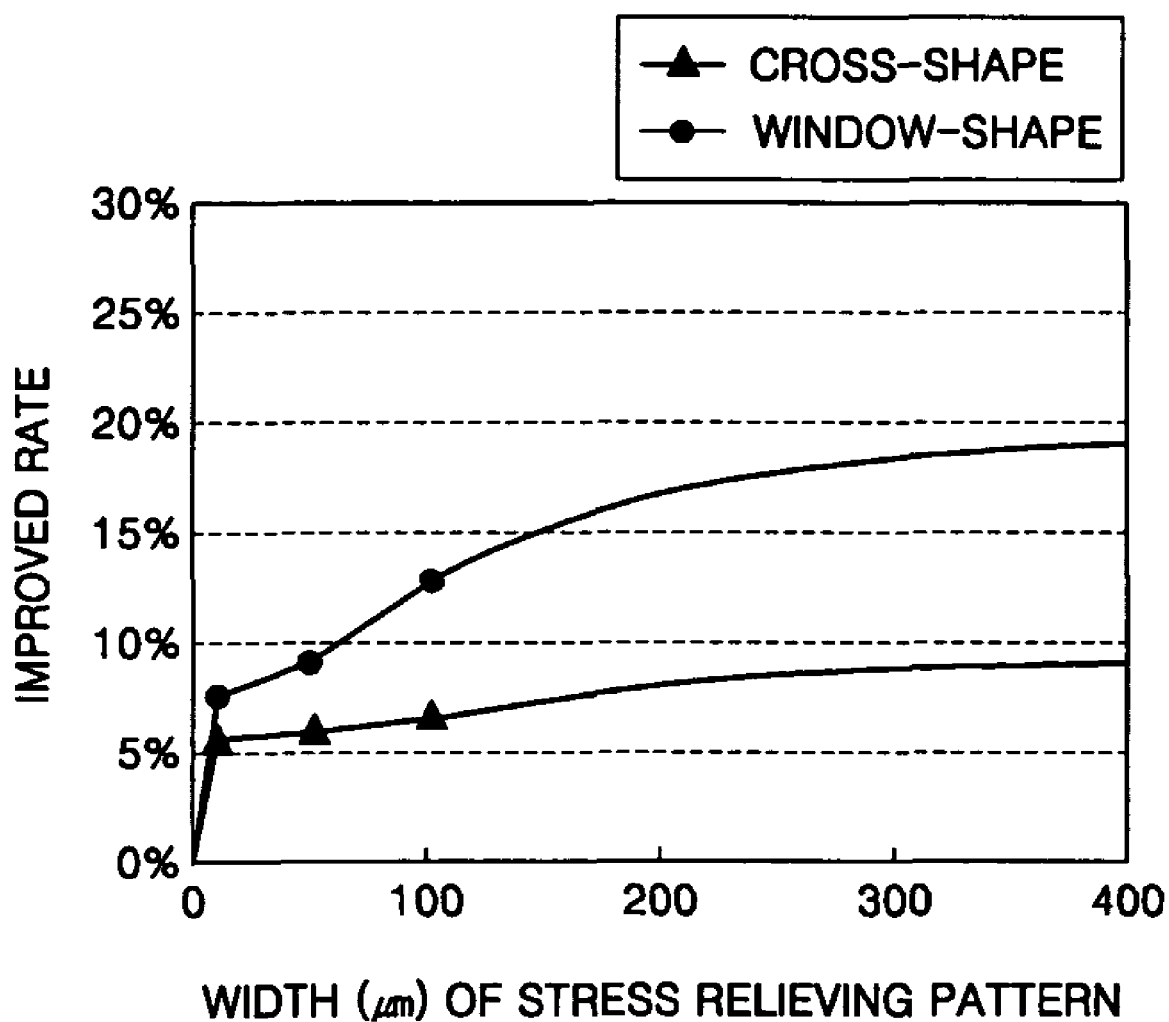
FIG. 9 is a graph plotting an improvement in die-warpage with respect to different widths of the stress relieving pattern in semiconductor devices according to the present invention.

There is no special restriction on the width $w_1$ of the pattern 225. A pattern 225 of any width $w_1$ and which traverses the layer 220 will alleviate some of the stress caused by the layer 220. In particular, the pattern 225 will alleviate the stress to at least a slightly greater extent than a corresponding stress-relieving pattern constituted by a mere interface as in the previous embodiment. Additionally, although there is no special restriction on the upper limit of the width $w_1$ of the pattern 225, preferably the width $w_1$ is less than ½ of the total width $w_2$ of the layer 220. More preferably, the width $w_1$ of the pattern 225 is preferably less than 20 μm considering that increases in the stress-relieving effect provided by the pattern 225 diminish logarithmically once the width $w_1$ of the pattern 225 exceeds 20 μm, as seen in the graph of FIG. 9.

The pattern 225 can be formed by semiconductor device manufacturing techniques, known per se to those of ordinary skill in the art. For instance, the layer 220 can be etched to form at least one trench traversing the layer 220. Then, material is buried in the trench by a deposition process to form the pattern 225. Alternatively, the pattern 225 can be formed first. Then the material of the layer 220 is deposited over the substrate 210 and pattern 225. Next, the resulting structure is planarized, thereby forming the layer 220 and exposing the pattern 225 such that the pattern 225 partitions the layer 220.

As shown in the embodiments of FIGS. 3A and 4A, the semiconductor chip is generally rectangular. In this case, die-warpage is worse in the direction of the longer dimension of the chip than in the direction of the shorter dimension. Therefore, the stress-relieving pattern 125, 225 preferably traverses the layer 120, 220 in the direction of the shorter dimension to alleviate the compressive stress applied in the direction of the longer dimension. Moreover, the stress-relieving pattern 125, 225 may partition the layer 120, 220 into even sections.

However, the present invention is not limited to a stress-relieving pattern configured as illustrated in the embodiments of FIGS. 3A and 4A. Rather, the stress-relieving pattern should be configured to most effectively minimize the die-warpage. In particular, the stress-relieving pattern should be configured in accordance with the shape of the semiconductor chip, the kind of material constituting the stress-inducing layer, the configuration of a circuit pattern that may exist within the stress-inducing layer, and the shape and arrangement of another stress-relieving pattern or a circuit pattern provided in the upper or lower portion of a layer adjacent the stress-inducing layer.

Figure 5A:
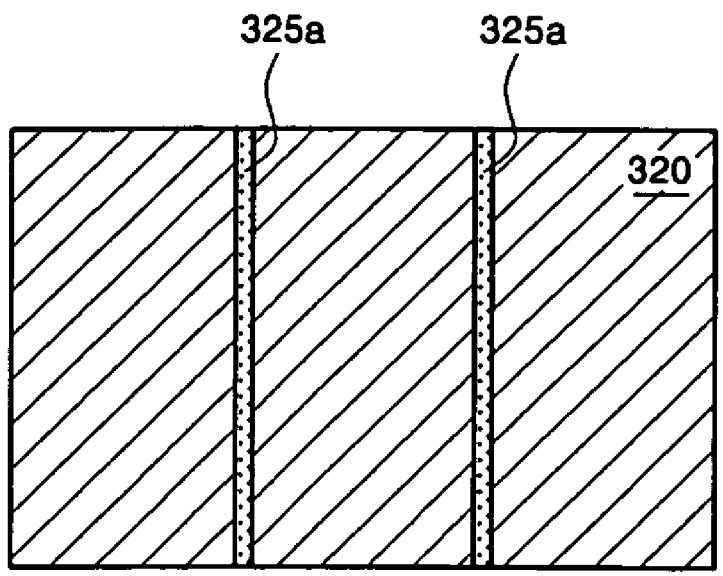
FIGS. 5A through 5C are plan views of chips illustrating stress relieving patterns of various other embodiments of a semiconductor device according to the present invention.
Figure 5B:
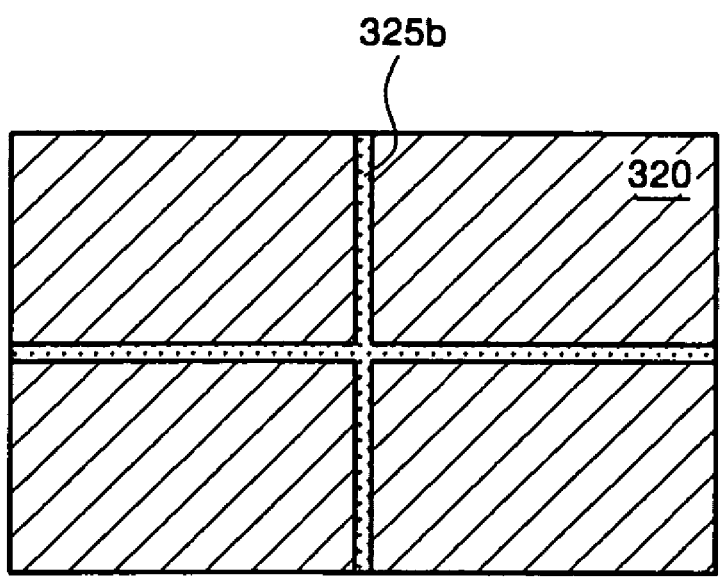
Figure 5C:
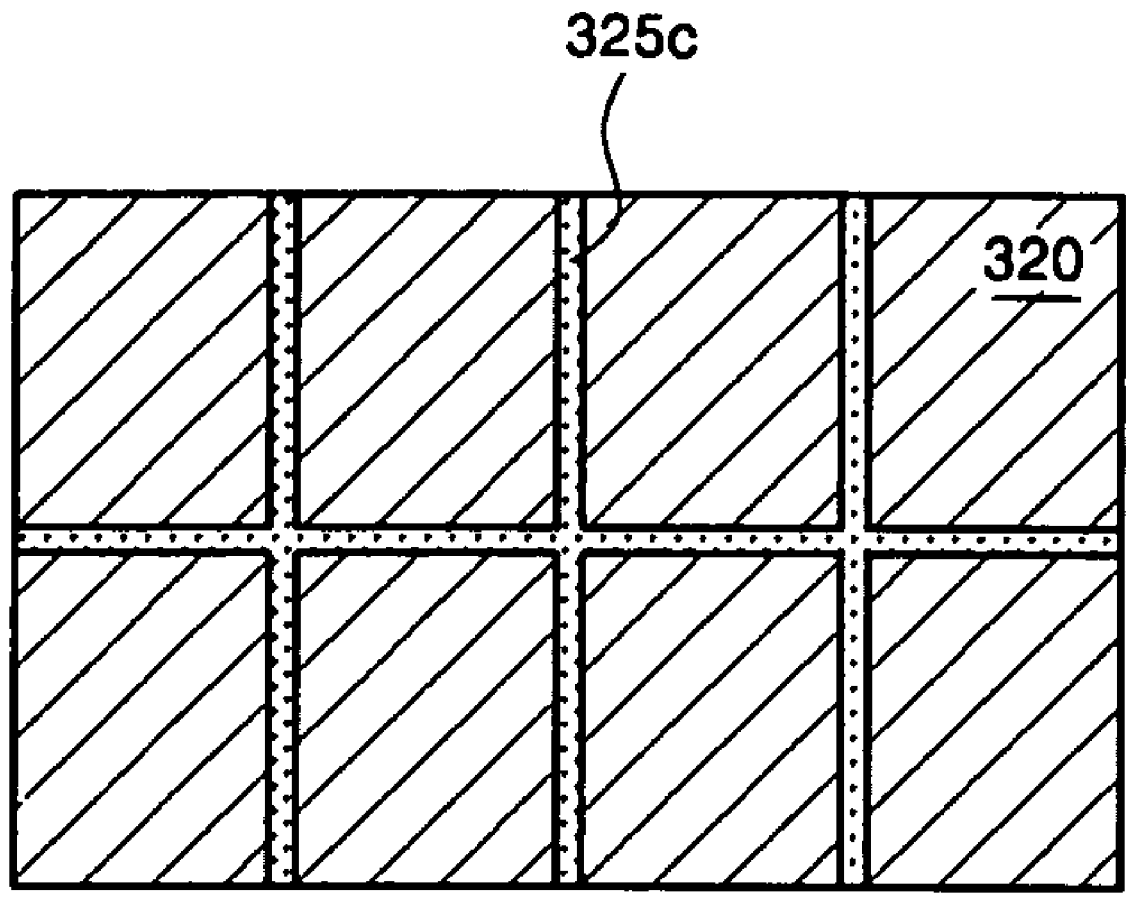

FIGS. 5A through 5C show other configurations of the stress-relieving patterns of semiconductor devices according to the present invention.

The stress-relieving pattern 325a shown in FIG. 5A is suitable for a semiconductor chip whose length exceeds its width by a great amount. The stress relieving pattern 325b shown in FIG. 5B is suitable for a semiconductor chip whose length exceeds its width by a relatively small amount. However, the stress-relieving patterns 325a, 325b are not limited for use in such applications.

Also, if the difference between width and length of the semiconductor chip is relatively great, the die-warpage occurs in both the longitudinal and transverse directions of the chip. In consideration of this fact, the stress-relieving pattern may include at least two segments that cross each other and traverse the stress-inducing layer 320. In the case of a rectangular semiconductor chip, the stress-relieving segments of the stress-relieving pattern thus cross at a right angle (refer to FIGS. 5B and 5C).

Referring to FIG. 5C, the layer 320 has a lattice-shaped stress-relieving pattern 325c that partitions the material of the layer 320 into eight discrete sections. Such a stress relieving pattern 325c is suitable for a large semiconductor chip or in a case in which a relatively great amount of stress is created by the layer 320, but is not necessarily limited for use in such applications. Furthermore, the stress relieving pattern 325c is not limited to having any particular number of segments, but preferably the number of segments is less than ten for a typical semiconductor device considering the need for ease in manufacture, manufacturing costs and limits above which additional segments do not significantly contribute to the stress-relieving function of the pattern.

Figure 6A:
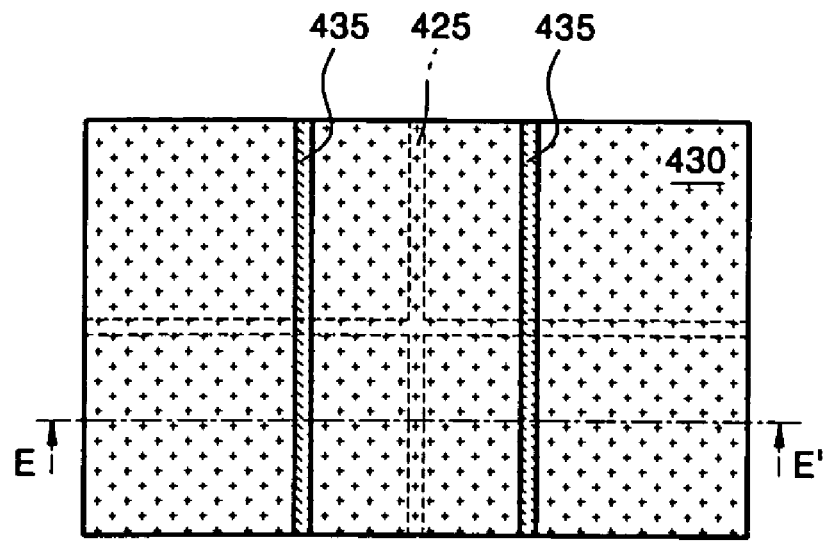
FIG. 6A is a plan view of a chip of still another embodiment of a semiconductor device according to the present invention.
Figure 6B:
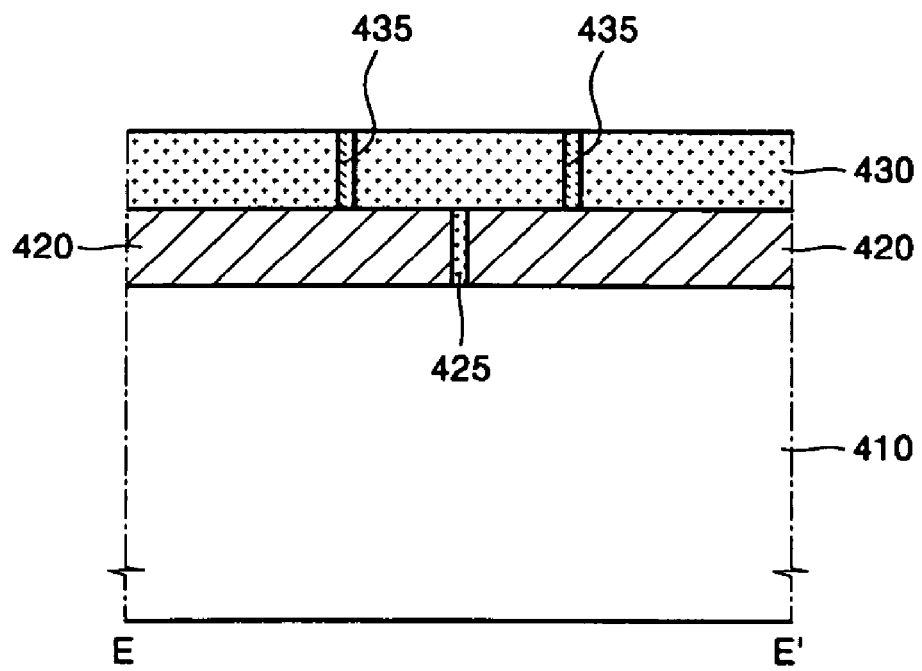
FIG. 6B is a sectional view of the chip of the semiconductor device, taken along line E-E' of FIG. 6A.

FIGS. 6A and 6B illustrate still another embodiment of a semiconductor the present invention. The semiconductor device includes a substrate 410, and a first layer 420 and a second layer 430 extending over the entire surface of the substrate 410. The first layer 420 and the second layer 430 have stress-relieving patterns 425 and 435, respectively. The stress-relieving patterns 425 and 435 may have configurations different from those illustrated.

Figure 7A:
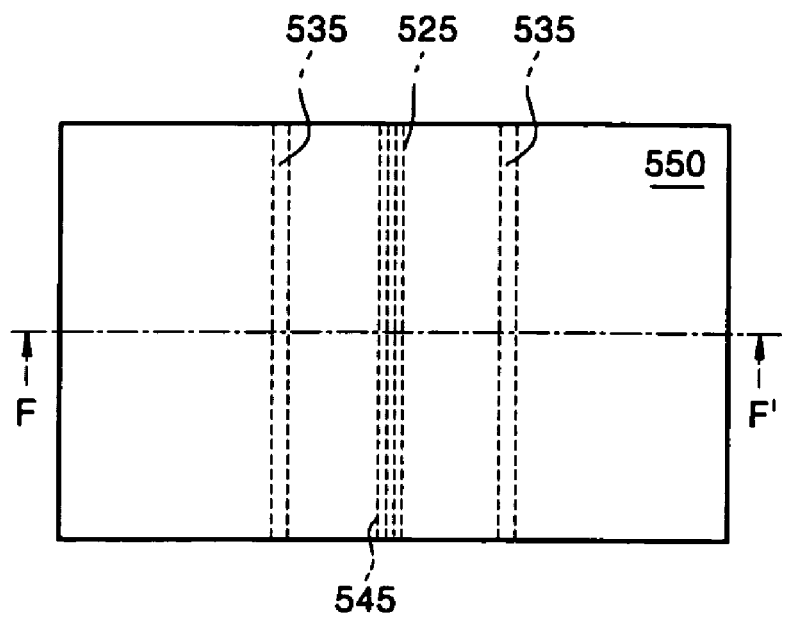
FIG. 7A is a plan view of a chip of yet another embodiment of a semiconductor device according to the present invention.
Figure 7B:
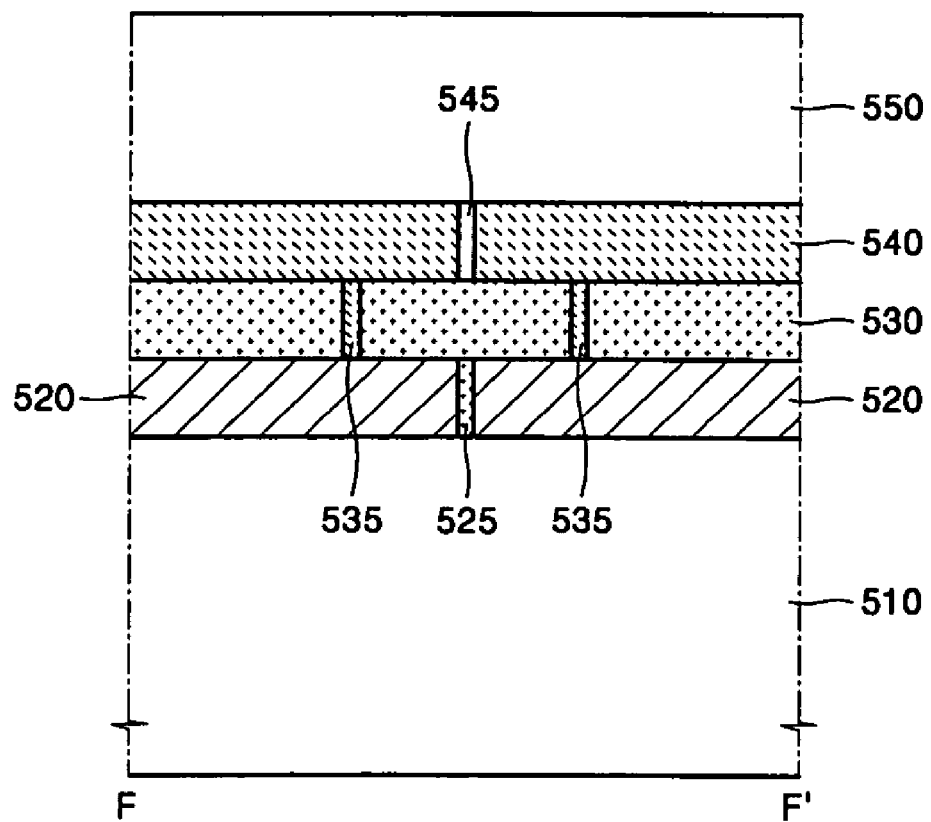
FIG. 7B is a sectional view of the chip of the semiconductor device, taken along line F-F' of FIG. 7A.

FIGS. 7A and 7B illustrate yet another embodiment of a semiconductor device according to the present invention. The semiconductor device includes a substrate 510, and a first layer 520, a second layer 530 and a third layer 540 extending over the entire surface of the substrate 510. The first layer 520, second layer 530 and third layer 540 have stress-relieving patterns 525, 535 and 545, respectively. Also, the stress-relieving patterns 525, 535 and 545 may have configurations different from those illustrated.

Referring to FIGS. 6A, 6B and 7A, 7B, the stress-relieving patterns 425 and 435, 525 and 535, and 535 and 545 of adjacent ones of the layers are preferably offset from each other. More specifically, none of the segments constituting the stress-relieving pattern of one layer is vertically aligned with a segment constituting the stress-relieving pattern of an adjacent layer. This effectively alleviates the total stress applied to underlying substrate.

Also, the stress-relieving patterns 425, 435, 525, 535 and 545 are illustrated as comprising material of a given width as described with respect to the embodiment of FIGS. 5A and 5B. In this case, the underlying stress-relieving patterns 425, 525 and 535 may be formed of the same material as the layers 430, 530 and 540 formed above them for ease of manufacturing. Alternatively, any of the stress-relieving patterns 425, 435, 525, 535 and 545 may be in the form of an interface between sections of the layers 420, 430, 520, 530 and 540, respectively, as described with respect to the embodiment of FIGS. 4A, 4B.

Figure 2A:
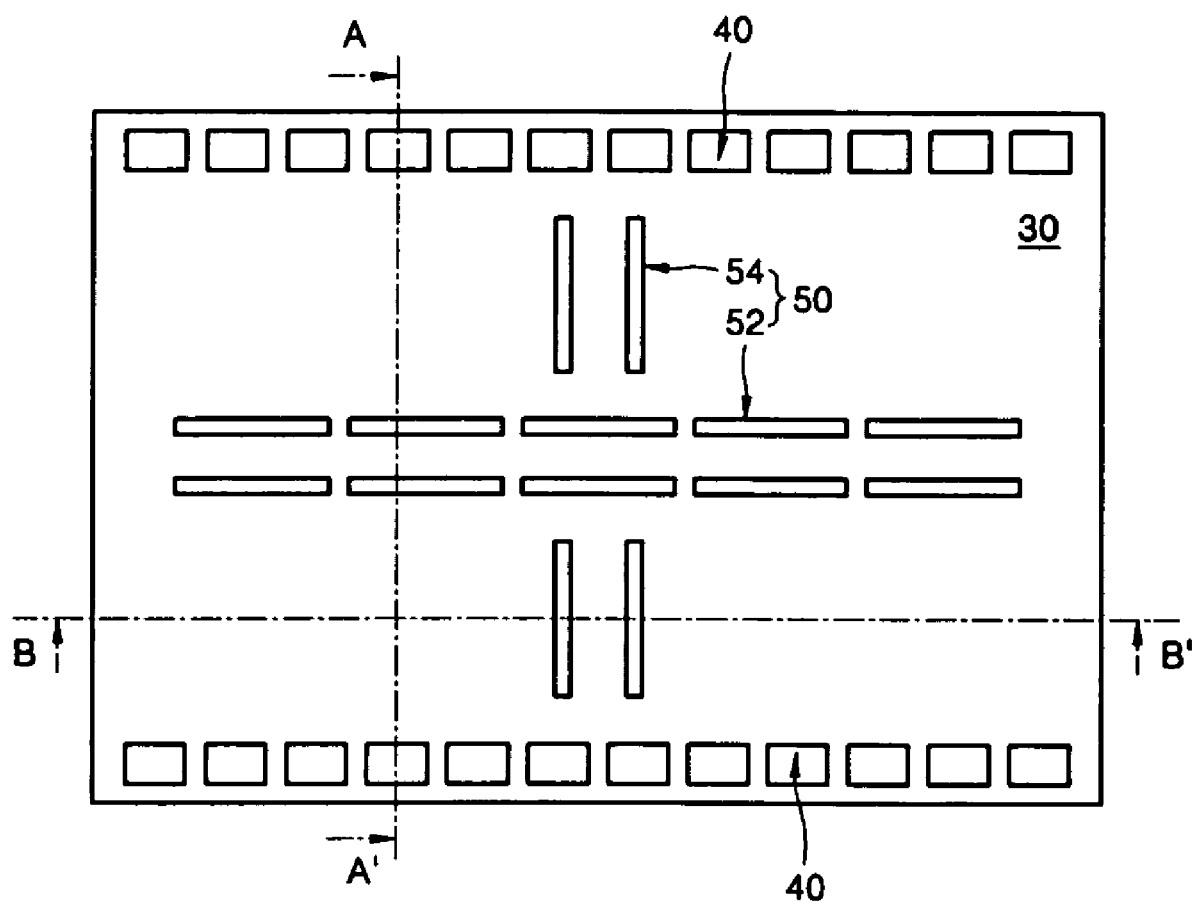
FIG. 2A is a plan view of a conventional semiconductor chip having a photosensitive polyimide layer.
Figure 2B:
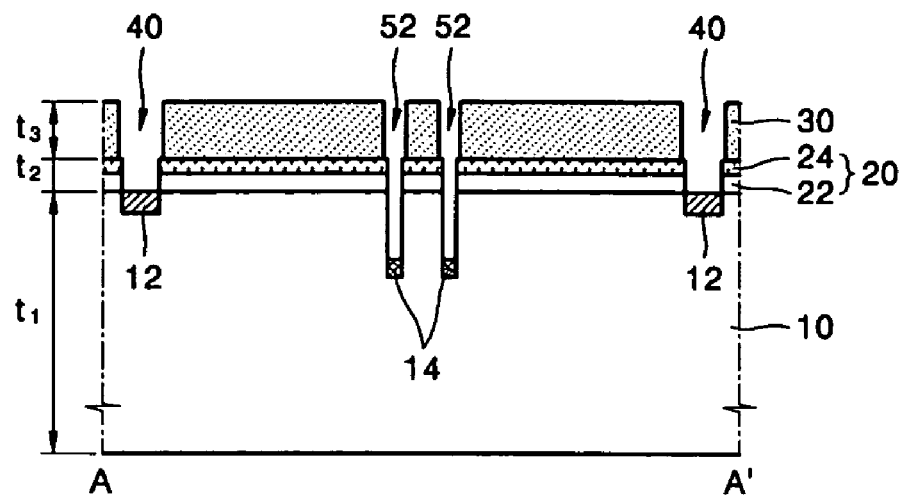
FIG. 2B is a sectional view of the semiconductor chip, taken along line A-A of FIG. 2A'.
Figure 2C:
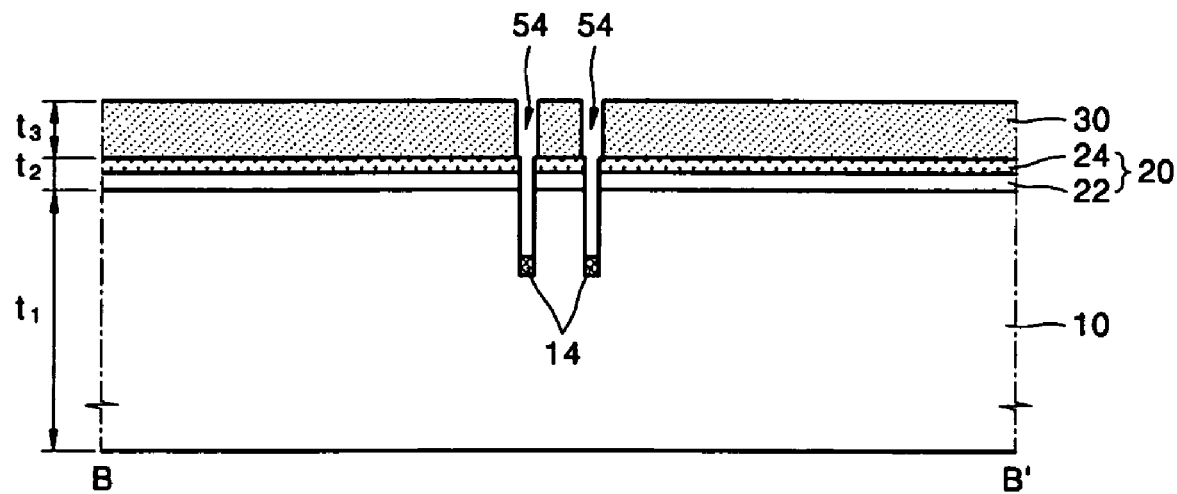
FIG. 2C is a sectional view of the semiconductor chip, taken along line B-B' of FIG. 2A.
Figure 8A:
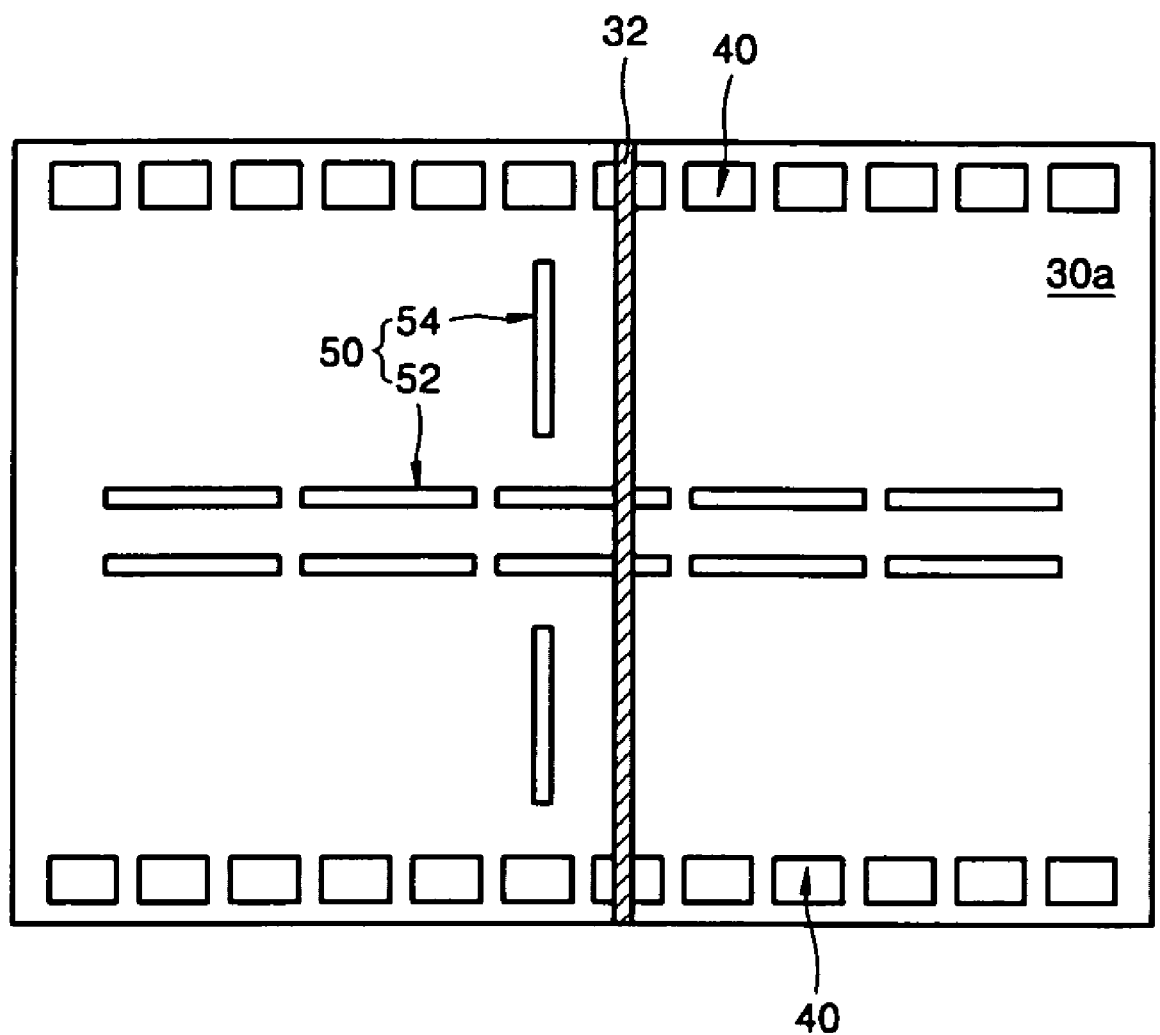
FIG. 8A is a plan view of a chip of one embodiment of a semiconductor device having a photosensitive polyimide layer according to the present invention.
Figure 8B:
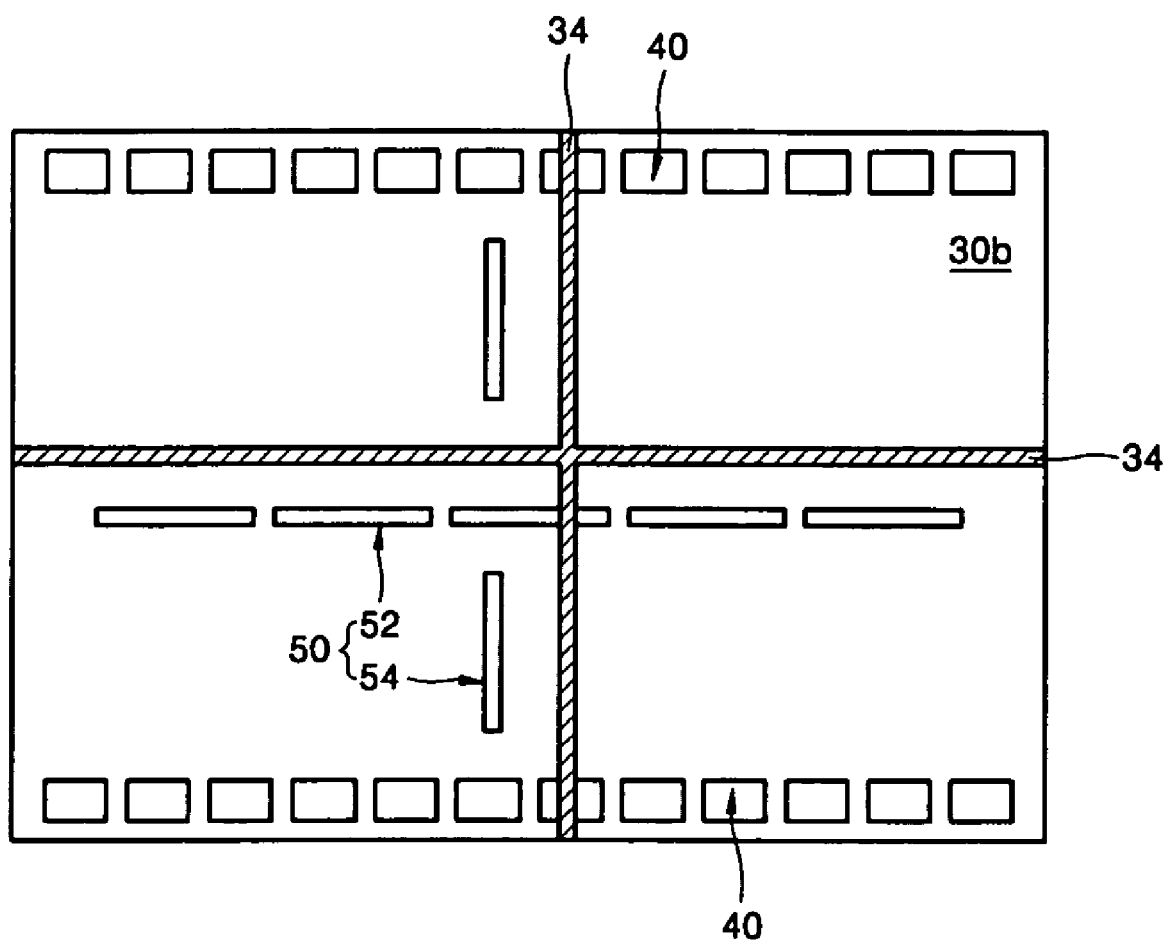
FIG. 8B is a plan view of a chip of another embodiment of a semiconductor device having a photosensitive polyimide layer according to the present invention.
Figure 8C:
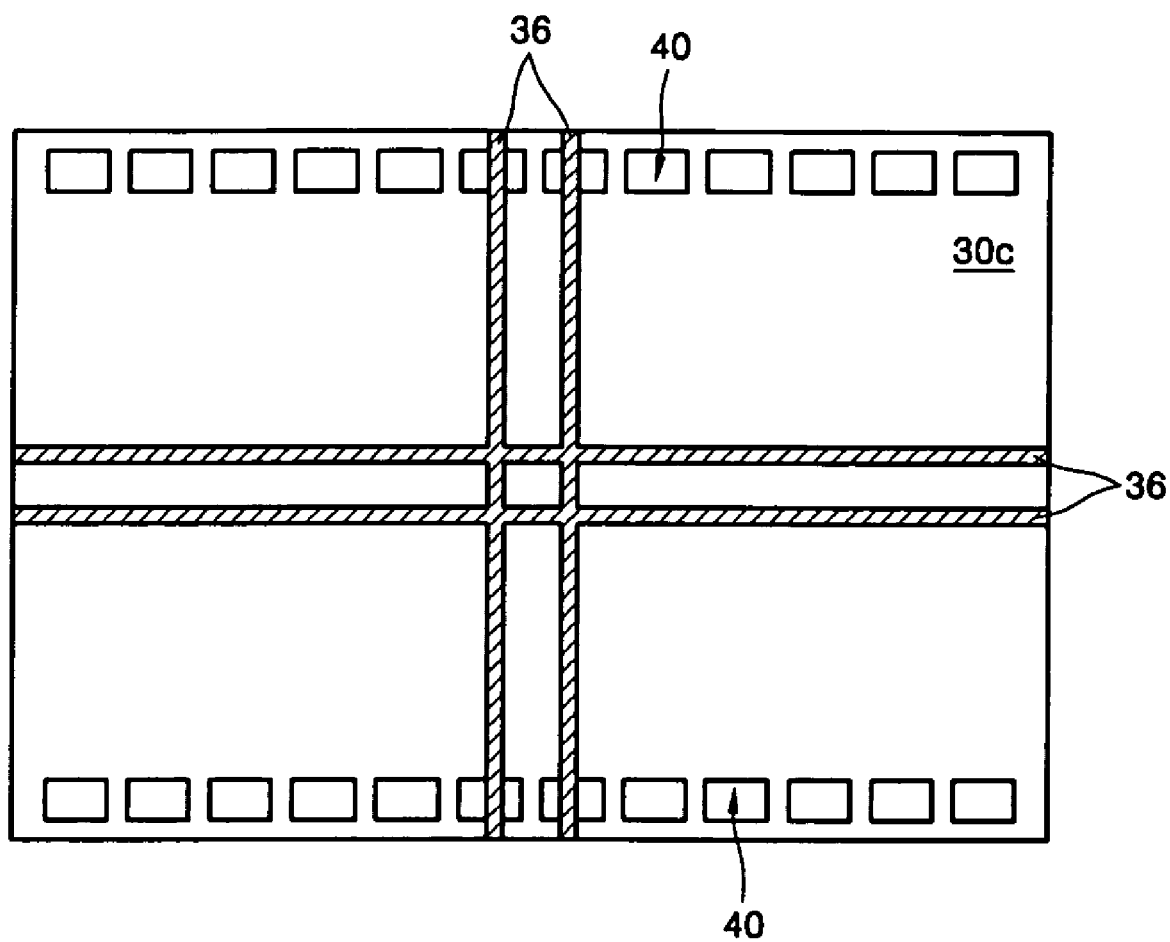
FIG. 8C is a plan view of a chip of still another embodiment of a semiconductor device having a photosensitive polyimide layer according to the present invention.

FIGS. 8A, 8B and 8C are plan views of semiconductor devices having photosensitive polyimide layers according to the present invention. The semiconductor devices may each have a structure similar to that of the conventional semiconductor device having a PSPI layer as shown and described with respect to FIGS. 2A through 2C. Thus, like parts will be designated by like reference numerals and a detailed description thereof will be omitted.

Referring now to FIGS. 8A, 8B and 8C, the semiconductor device has a substrate, and a PSPI layer 30a, 30b, 30c extending over the entire surface of the substrate. The PSPI layer 30a, 30b, 30c has first through-holes 40 that expose electrode pads formed in the upper surface of the substrate, and second through-holes 50 that expose fuse lines extending in the substrate at a level beneath the upper surface thereof. For example, the first through-holes 40 are located along edges of the substrate 10, and the second through-holes 50 are arranged in rows extending longitudinally and transversely in the PSPI layer.

The PSPI layer 30a, 30b 30c also has a stress-relieving pattern 32, 34, 36 traversing the PSPI layer 30a, 30b, 30c. There is no restriction on the form (interface or wall of a predetermined width) and/or configuration of the stress relieving pattern 32, 34, 36. However, in the case in which the second through-holes 50 traverse the central region of the substrate as in the illustrated embodiments, the stress-relieving pattern 32, 34, 36 preferably has at least one segment extending in the same direction as a row of the second through-holes 50. For example, as shown in FIG. 8A, the stress-relieving pattern 32 may traverse the PSPI layer 30a in the same direction as the rows 54 of the second through-holes 50. Also, as shown in FIG. 8B, the stress-relieving pattern 34 may be a cross-shaped pattern that extends in the same directions as the rows 52, 54 of the second through-holes 50. Furthermore, as shown in FIG. 8C, the stress-relieving pattern 36 may be a pair of crosses that each extend in the same directions as the rows 52, 54 of the second through-holes 50.

The stress-relieving patterns 32, 34 and 36 can easily be manufactured by general techniques known per se in the semiconductor device manufacturing art. For example, trenches for forming the stress-relieving patterns 32, 34 and 36 may be formed at the same time as and by the same technique used to form the first and second through-holes 40 and 50. Then, an epoxy is buried in the trenches during a subsequent package process, to thereby complete the forming of the stress-relieving patterns 32, 34 and 36. In this case, there is no need to from the trenches by a process that is additional to that used to form the first and second through-holes 40 and 50. However, in some cases, the trenches may be formed by a process separate from the process of forming the first and second through-holes 40 and 50.

Also, as was described above in connection with a conventional semiconductor device having a PSPI layer, a passivation layer (20 in FIGS. 2B and 2C) is provided on the substrate beneath the PSPI layer. In the semiconductor device according to the present invention, a stress-relieving pattern may also be formed in the passivation layer. For example, when the passivation layer is a composite of an HDP oxide layer and a silicon nitride layer, the stress-relieving pattern may be formed in both the HDP oxide layer and the silicon nitride layer. Alternatively, a stress-relieving pattern may be formed in only the HDP oxide layer or the silicon nitride layer. Preferably, the stress-relieving pattern of the passivation layer is not vertically aligned with the stress-relieving pattern of the PSPI layer.

FIG. 9 is a graph showing the improvement in die-warpage offered by semiconductor devices according to the present invention. More specifically, FIG. 9 shows the improvement in die-warpage in connection with stress-relieving patterns in the form of walls of material of various widths in a PSPI layer. The results shown in FIG. 9 are for a semiconductor device including a PSPI layer having a cross-shaped stress-relieving pattern as shown in FIG. 5B and for a semiconductor device including a PSPI layer having a lattice-like stress relieving-pattern as shown in FIG. 5C. In this graph, the improvement in die-warpage is represented mathematically by the following Equation 1:

$$\text{Improvement} = \frac{a-b}{a} \times 100 \quad \text{[Equation 1]}$$

wherein α denotes the relative difference in height between the center and the edge of the substrate when the stress-relieving pattern is not provided, as in the prior art, and b denotes the relative difference in height between the center and the edge of the substrate when the stress-relieving pattern is provided according to the present invention.

Referring to FIG. 9, die-warpage is improved regardless of whether the stress-relieving pattern is cross-shaped or lattice-shaped. Although. Even when the width of the stress-relieving pattern is small, i.e., when the stress-relieving pattern is in the form of an interface of the PSPI layer or is in the form of a wall of material having a width less than 0.1 μm), die-warpage is improved by roughly 5~8% compared to the case in which a corresponding PSPI layer does not have a stress-relieving pattern. The die-warpage is more effectively reduced up to a point by stress-relieving patterns that are wider than 0.1 μm. Also, the results of FIG. 9 show that beyond the small widths, a stress-relieving pattern having more segments that traverse the PSPI layer also more effectively reduces the die-warpage compared to a stress-relieving pattern having a fewer number of such segments. That is, beyond a width of 0.1 μm, the lattice-shaped stress-relieving pattern showed a greater ability to prevent die-warpage than a cross-shaped lattice pattern of the same width.

According to the present invention, therefore, the configuration of the stress-relieving pattern(s) is based on characteristics of the die-warpage that the device would otherwise exhibit if the stress-relieving pattern(s) were not present. More specifically, first, the die of the semiconductor device is designed. The design parameters include the specifications of the die such as the thickness of the substrate, the thicknesses of the layers that are to be stacked on the substrate, and the materials from which the substrate and the layers are to be fabricated. Then, the die-warpage that the device would exhibit is characterized before the die is fabricated according to its design parameters. For example, the relative difference in height that will exist between outer edges of the die and a central portion of the die is quantified, as shown in FIG. 1. These measurements can be as the result of a simulation or taken from an actual prototype of the device fabricated without the stress-relieving pattern(s). Subsequently, the die is fabricated according to the design parameters but, in this case, the stress-relieving pattern(s) is provided. The stress-relieving pattern is formed, based on the characterization of the die-warpage, in such a way as to mitigate stress that would otherwise be applied to the substrate in the die. For example, the configuration of the stress-relieving pattern (cross-shaped, lattice-shaped, etc.) and/or the form of the stress-relieving pattern (interface or wall) is/are determined on the basis of the die-warpage.

The semiconductor device according to the present invention includes a respective stress-relieving pattern traversing at least one layer of material extending across a relatively wide area of the substrate of the device. As a result, stress, particularly compressive stress, otherwise applied by the layer(s) to the underlying substrate is alleviated. Therefore, die-warpage is prevented to a great extent. Accordingly, process defects are prevented from occurring during subsequent processes and the die is prevented from being damaged. Hence, the reliability of the semiconductor device is ensured. Furthermore, the stress-relieving pattern can be formed in a layer, such as a photosensitive polyimide layer, without the need to perform a process that is in addition to those used to manufacture a corresponding device that does not have such a stress-relieving pattern. Accordingly, a semiconductor device according to the present invention is relatively simple to manufacture compared to a corresponding prior art device.

Finally, although the present invention has been particularly shown and described with reference to the preferred embodiments thereof, various changes in the form and details of the preferred embodiments will be apparent to those of ordinary skill in the art. Thus, the preferred embodiments may be changed and modified within the true spirit and scope of the present invention as defined by the following claims.

What is claimed is:

1. A semiconductor device comprising:
a chip-sized substrate including at least one of a plurality of circuit devices and a plurality of interconnect patterns at an upper surface thereof;
a first layer of material extending over substantially the entire upper surface of the substrate, and
a second layer of material disposed directly on the first layer of material;
wherein a stress-relieving pattern exists in the first layer and traverses the first layer so as to partition the first layer into at least two discrete sections, whereby stress otherwise applied to the substrate by the first layer is mitigated by the stress-relieving pattern,
wherein the stress-relieving pattern is a wall of a second material comprising an epoxy that is different from the material of the first layer,
wherein the wall constituting the stress-relieving pattern is of the same material as the second layer, and
wherein the second layer extends over substantially the entire surface of the first layer, and a stress-relieving pattern exists in and traverses the second layer so as to partition the second layer into at least two discrete sections.

2. The semiconductor device of claim 1, wherein the stress-relieving pattern is lattice-shaped.

3. The semiconductor device of claim 1, wherein the stress-relieving pattern is cross-shaped.

4. The semiconductor device of claim 1, wherein the stress-relieving pattern has only 2~10 segments that traverse the first layer of material.

5. The semiconductor device of claim 1, wherein the substrate is rectangular, and at least one segment of the stress-relieving pattern traverse the first layer of material as extending parallel to the shorter of the sides of the rectangular substrate.

6. The semiconductor device of claim 5, wherein the stress-relieving pattern has only one segment.

7. The semiconductor device of claim 5, wherein the at least segment partitions the first layer of material into equal sections.

8. The semiconductor device of claim 1, wherein the stress-relieving pattern is an interface of the discrete sections of the first layer of material.

9. The semiconductor device of claim 1, wherein the width of the wall is 0.01~20 µm.

10. The semiconductor device of claim 1, wherein each of the stress-relieving patterns is made up of at least one segment that traverses the respective layer in which it exists, and at least one segment of the stress-relieving pattern in the second layer is offset with respect to the stress-relieving pattern in the first layer.

11. The semiconductor device of claim 10, wherein none of the segments of the stress-relieving pattern in the second layer of material is vertically aligned with any of the segments of the stress-relieving pattern in the first layer of material.

12. The semiconductor device of claim 1, wherein the first layer of material is one of an interlayer insulating layer, a passivation layer and a photosensitive polyimide layer.

13. A semiconductor device comprising:
a chip-sized substrate; and
a first layer of material extending over substantially the entire surface of the substrate, and
wherein a stress-relieving pattern exists in the first layer and traverses the first layer so as to partition the first layer into at least two discrete sections, whereby stress otherwise applied to the substrate by the first layer is mitigated by the stress-relieving pattern, and
wherein the semiconductor device further comprises a conductive material extending at and/or beneath an upper surface of the substrate, and wherein a plurality of through-holes extend through the first layer of material and expose the conductive material, and the first stress-relieving pattern connects at least some of the through-holes.

14. A semiconductor device comprising:
a chip-sized substrate including a plurality of connection pads at an upper surface thereof;
a first layer of material extending over substantially the entire upper surface of the substrate; and
a second layer of material extending over substantially the entire surface of the first layer, and
wherein a stress-relieving pattern exists in and traverses the second layer so as to partition the second layer into at least two discrete sections, and wherein a plurality of through-holes extend through the first and second layers of material and expose the connection pads, and
wherein the stress-relieving pattern connects at least some of the through-holes at portions thereof which extend through the second layer of material.

15. The semiconductor device of claim 14, wherein the stress-relieving pattern is lattice-shaped.

16. The semiconductor device of claim 15, wherein the stress-relieving patterns is cross-shaped.

17. The semiconductor device of claim 14, wherein the stress-relieving patterns has only 2~10 segments that traverse the first layer of material.

18. The semiconductor device of claim 14, wherein the substrate is rectangular, and at least one segment of the stress-relieving pattern traverse the first layer of material as extending parallel to the shorter of the sides of the rectangular substrate.

19. The semiconductor device of claim 18, wherein the stress-relieving pattern has only one segment.

20. The semiconductor device of claim 14, wherein the first layer is a passivation layer, and the second layer is a photosensitive polyimide layer.

21. The semiconductor device of claim 20, wherein the stress-relieving pattern connects at least some of the through-holes at portions thereof which extend through the photosensitive polyimide layer.

22. The semiconductor device of claim 21, wherein the stress-relieving pattern is lattice-shaped.

23. The semiconductor device of claim 22, wherein the stress-relieving pattern is cross-shaped.

24. The semiconductor device of claim 21, wherein the chip-sized substrate further includes fuse lines at the upper surface thereof, and the stress-relieving pattern connects at least some of the through-holes that expose the fuse lines.

25. The semiconductor device of claim 20, wherein the stress-relieving patterns has only 2~10 segments that traverse the photosensitive polyimide layer.

26. The semiconductor device of claim 20, wherein the substrate is rectangular, and at least one segment of the stress-relieving pattern traverse the first layer of material as extending parallel to the shorter of the sides of the rectangular substrate.

27. The semiconductor device of claim 26, wherein the stress-relieving pattern has only one segment.

28. The semiconductor device of claim 20, wherein the passivation layer is a composite layer of silicon nitride and silicon oxide.

29. The semiconductor device of claim 28, wherein a stress-relieving pattern exists in the passivation layer and traverses the passivation layer so as to partition the passivation layer into at least two discrete sections.

30. The semiconductor device of claim 29, wherein each of the stress-relieving patterns is made up of at least one segment that traverses the respective layer in which it exists, and at least one segment of the stress-relieving pattern in the passivation layer is offset with respect to the stress-relieving pattern in the photosensitive polyimide layer.

31. The semiconductor device of claim 30, wherein none of the segments of the stress-relieving pattern in the photosensitive polyimide layer is vertically aligned with any of the segments of the stress-relieving pattern in the passivation layer.

32. The semiconductor device of claim 29, wherein at least one of the segments of the stress-relieving pattern in the passivation layer is aligned with a respective segment of the stress-relieving pattern in the photosensitive polyimide layer.

33. The semiconductor device of claim 20, wherein the stress-relieving pattern is an interface of the discrete sections of the photosensitive polyimide layer.

34. The semiconductor device of claim 20, wherein the stress-relieving pattern in the photosensitive polyimide layer is a wall of a material different from the photosensitive polyimide.

35. The semiconductor device of claim 34, wherein the material constituting the stress-relieving pattern in the photosensitive polyimide layer is buried in the photosensitive polyimide layer within portions of the through-holes that extend through the photosensitive polyimide layer.

36. The semiconductor device of claim 35, wherein the width of the wall is 0.01~20 μm.

37. The semiconductor device of claim 14, wherein the stress-relieving pattern is an interface of the discrete sections of the first layer of material.

38. The semiconductor device of claim 14, wherein the stress-relieving pattern is a wall of a material that is different from the material of the second layer.

39. The semiconductor device of claim 38, wherein the width of the wall is 0.01~20 μm.

40. The semiconductor device of claim 14, wherein a stress-relieving pattern exists in the first layer and traverses the first layer so as to partition the first layer into at least two discrete sections.

41. The semiconductor device of claim 40, wherein each of the stress-relieving patterns is made up of at least one segment that traverses the respective layer in which it exists, and at least one segment of the stress-relieving pattern in the first layer of material is offset with respect to the stress-relieving pattern in the second layer.

42. The semiconductor device of claim 41, wherein none of the segments of the stress-relieving pattern in the second layer of material is vertically aligned with any of the segments of the stress-relieving pattern in the first layer of material.

43. The semiconductor device of claim 40, wherein at least one of the segments of the stress-relieving pattern in the first layer of material is aligned with a respective segment of the stress-relieving pattern in the second layer of material.

* * * * *